United States Patent
Ishii et al.

(10) Patent No.: US 7,375,399 B2
(45) Date of Patent: May 20, 2008

(54) SEMICONDUCTOR MEMORY DEVICE

(75) Inventors: Tomoyuki Ishii, Kodaira (JP);
Toshiyuki Mine, Fussa (JP); Toshiaki Sano, Kodaira (JP); Norifumi Kameshiro, Kokubunji (JP)

(73) Assignee: Renesas Technology Corp., Tokyo (JP)

( * ) Notice: Subject to any disclaimer, the term of this patent is extended or adjusted under 35 U.S.C. 154(b) by 299 days.

(21) Appl. No.: 11/156,558

(22) Filed: Jun. 21, 2005

(65) Prior Publication Data
US 2005/0280000 A1   Dec. 22, 2005

(30) Foreign Application Priority Data
Jun. 22, 2004   (JP) ............... 2004-183338

(51) Int. Cl.
*H01L 29/76* (2006.01)
*H01L 29/94* (2006.01)

(52) U.S. Cl. ............. 257/365; 257/365; 257/500

(58) Field of Classification Search ........ 257/365, 257/500, 368–369, E29, E31
See application file for complete search history.

(56) References Cited

U.S. PATENT DOCUMENTS

| 5,615,150 | A * | 3/1997 | Lin et al. ........... 365/185.17 |
| 6,198,140 | B1 * | 3/2001 | Muramoto et al. ....... 257/392 |
| 6,232,631 | B1 * | 5/2001 | Schmidt et al. ........ 257/315 |
| 2003/0025164 | A1 * | 2/2003 | Lee ..................... 257/365 |

OTHER PUBLICATIONS

M. Yamaoka et al., "A 300MHz 25μA/Mb Leakage On-Chip SRAM Module Featuring Process-Variation Immunity and Low-Leakage-Active Mode for Mobile-Phone Application Processor", *IEEE International Solid-State Circuit Conference*, 2004, pp. 494, 495, 592.

H. Shichijo et al., "TITE RAM: A New SOI DRAM Gain Cell for Mbit DRAM's", *Conference on Solid-State Devices and Materials*, 1984, pp. 265-268.

S. Shukuri et al., "A Complementary Gain Cell Technology for Sub-IV Supply DRAMs", *IEEE International Electron Devices Meeting*, 1992, pp. 1006-1008.

T. Osabe et al., "A Single-Electron Shut-Off Transistor for a Scalable Sub-0.1-μ Memory", *IEEE International Electron Devices Meeting*, 2000, pp. 301-304.

* cited by examiner

*Primary Examiner*—Theresa T Doan
(74) *Attorney, Agent, or Firm*—Miles & Stockbridge PC

(57) ABSTRACT

The present invention is a semiconductor memory device having a logic block and a memory block on the same chip. In the memory device, unit memory cells each include at least two transistors, one of which is a write transistor for storing an electric charge into and releasing it from an electric charge storage node, and the other is a read transistor whose conductance in a channel region provided between a source and drain of the read transistor is modulated dependently on the amount of electric charge stored into or released from the electric charge storage node by the write transistor. The read transistor has a gate-insulating film thicker than that of a transistor provided in the logic block, and uses the same diffusion layer structure as that of the logic block.

19 Claims, 13 Drawing Sheets

SEMICONDUCTOR MEMORY DEVICE

CLAIM OF PRIORITY

The present application claims priority from Japanese application JP 2004-183338, filed on Jun. 22, 2004, the content of which is hereby incorporated by reference into this application.

BACKGROUND OF THE INVENTION

1. Field of the Invention

The present invention relates to semiconductor memory devices, and more particularly, to a semiconductor memory device that can simultaneously achieve both process consistency with logic transistors, and cost reduction.

2. Description of the Related Art

With the progress of circuit pattern miniaturization, it has become possible to integrate a greater number of transistors on one chip and to endow the chip with a greater number of functions correspondingly. Compared with a processor/memory independent chip structure, on-chip memories each mounted together with a processor in mixed form on the same chip are superior in terms of both data transfer rate and electric power consumption. As mobile apparatus, including hand-held telephones and personal data assistants (PDAs), is more advanced in function, the role that on-chip memories are to play is becoming more important since greater importance is attached to simultaneous realization of a more advanced function and less power consumption. Conventionally, SRAMs have been exclusively used because of their manufacturing process consistency with logic transistors. A conventional technology associated with an on-chip low-power SRAM is described in the technical paper "M. Yamaoka et al., IEEE International Solid-State Circuit Conferences, 2004, pp. 494-495."

DRAMs are known as memories higher than SRAMs in integration density. However, DRAMS are low in process consistency with logic transistors. This is because DRAMs adopt the principles of operation in which they store electric charges into capacitors, and thus because the introduction not only of $Ta_2O_5$ (tantalum pentoxide) or other highly dielectric materials, but also of stereographic construction, is absolutely needed to ensure capacitance of at least a fixed level with a finer-cell area. A memory element structure called the gain cell is proposed as a DRAM that can operate without taking special capacitor construction. This memory element structure performs a memory function by storing an electric charge into a memory node via a write transistor and utilizing a change in the threshold voltage of a separately provided read transistor according to the stored charge. For the sake of description, two types of memory cell equivalent circuits, both employing gain cell construction, are shown in FIGS. 1A and 1B. FIG. 1A shows two-transistor construction, and FIG. 1B shows three-transistor construction. The following description uses the words "read transistor", "write transistor", and "select transistor", in the relevant relationship between FIGS. 1A, 1B. Conventional technologies associated with the present invention are described in the technical papers "H. Shichijo et al., Conference on Solid-State Devices and Materials, 1984, pp. 265-268" and "S. Shukuri et al., IEEE International Electron Devices Meeting, 1992, pp. 1006-1008." The former of the above two papers discusses a write transistor that uses polycrystalline silicon, and the latter, a read transistor that uses polycrystalline silicon. Also, a gain cell memory that uses polycrystalline silicon is discussed in the technical paper "T. Osabe et al., IEEE International Electron Devices Meeting, 2000, pp. 301-304." This paper describes a gain cell memory that ensures a sufficient hold time by utilizing the fact that a TFT using an ultrathin polycrystalline silicon film to form a channel is extremely small in leakage current.

SUMMARY OF THE INVENTION

As described above, the DRAMs that use gain cells prevail as the memories superseding the SRAMs formerly used as on-chip memories. In particular, the memory described in the technical paper "T. Osabe et al., IEEE International Electron Devices Meeting, 2000, pp. 301-304" is expected to achieve a sufficient length of information hold time, in spite of a charge storage capacity being smaller than that of a conventional DRAM of a single-transistor single-capacitor construction, by using a transistor specially small in leakage current. Accordingly, it is possible to realize a memory extendable in refresh cycle and smaller in electric power consumption. The above gain cell memory construction is excellent in process consistency with a logic transistor, since as mentioned above, special capacitor construction is typically not required. With a view to applying the gain cell memory construction to a logic-mixed memory, the present inventors conducted their own close studies to find the problems below. That is to say, the gate-insulating film of the read transistor needs to have a thickness of at least 3 nm, since thinning down this film to about 3 nm or less results in the stored charge being lost by the tunneling current of the gate-insulating film.

However, since this film thickness is smaller than the transistor gate-insulating film thickness of the logic block, the read transistor cannot be used as a transistor for logic. Meanwhile, transistors formed of thicker gate-insulating films are used in the circuit for connection to an external power supply. Transistors with gate-insulating film thicknesses of about 7 nm or of about 5 nm are used for a 3.3-V or 2.5-V external power supply, for example. These transistors, however, are large in gate length, and using these transistors to form a memory cell increases a cell area. A film with a thickness of about 5 nm is also used for the pass transistor of the memory cell in a DRAM of a single-transistor single-capacitor construction. This pass transistor has a specially designed diffusion layer structure so that a relatively short gate can be used. In this case, however, since a special ion-implanting process needs to be repeated several times to form the diffusion layer, the number of processes required increases and this increases costs. Although the description here has assumed the use of $SiO_2$ as the gate-insulating film material, it may be possible to use a different material instead, such as a nitrogen-containing $SiO_2$ film, silicon nitride film, hafnium oxide, or alumina. In the latter case, the same problems as mentioned above will also arise if the relevant statements are reread to mean such a gate-insulating film thickness (usually, greater than that obtainable by using $SiO_2$) as reducing the leakage current to the same level. Additionally, to minimize leakage in the write transistor, it is important to form an ultrathin channel film, and the present inventors have found that there are problems associated with the crystallization of the channel.

FIG. 2 shows experimental results of the crystallization temperatures of the silicon films which were deposited to various film thicknesses in an amorphous state. The present inventors conducted 30-minute-annealing at each temperature to find that the crystallization temperature abruptly increases at a film thickness of 5 nm or less and exceeds 800° C. at a film thickness of 3 nm or less. The application of this temperature to annealing coagulates the cobalt silicide used in the diffusion layer of the logic transistor, and for reducing the gate electrode in resistance. It is known that silicon films with a thickness of 10 nm or more become crystallized at 700° C. or less, and thus, the problem of coagulation does not occur. The experimental plots of 10 nm or more in FIG. 2 mean that it suffices just to crystallize the film at 700° C., and in fact, the crystallization temperature is expected to change as denoted by the solid line.

An object of the present invention is therefore to provide a method for realizing a low-cost semiconductor memory device consistent with a logic transistor in terms of process.

The above object can be fulfilled by constructing a semiconductor memory device that has, on one chip, a logic block, a memory block constituted by a plurality of unit memory cells, and a high-voltage block adapted to supply electric power. In the memory device, the unit memory cells each include at least two transistors, one of which is a write transistor connected at either a source or drain thereof to a bit line and at the other to an electric charge storage node, the write transistor storing an electric charge into, and releasing the electric charge from, the electric charge storage node, and the other is a read transistor whose conductance in a channel region provided between a source and drain of the read transistor is modulated dependently on the amount of electric charge stored into or released from the electric charge storage node by the write transistor. The read transistor has a gate-insulating film thicker than that of a transistor provided in the logic block. In addition, a diffusion layer that determines gate length of the read transistor is provided adjacently to a high-density impurity diffusion region which forms part of the source or drain of the read transistor, the above diffusion layer having a junction depth smaller than, and an impurity density higher than, those of a diffusion layer which determines gate length of the transistor constituting the high-voltage block.

The above object can likewise by achieved by either:

using silicon (5 nm or less in thickness) to form the channel region of the write transistor;

using amorphous silicon to form the channel region of the write transistor; or using metal to form the gate electrode of the write transistor.

A method for realizing a low-cost semiconductor memory device consistent with a logic transistor in terms of process can be provided in this way.

DETAILED DESCRIPTION OF THE PREFERRED EMBODIMENTS

Embodiments of the present invention will be described in detail below in accordance with the accompanying drawings. The same reference number or symbol will, in principle, be assigned to the same member in all figures used to describe embodiments, and a repeated description of the same member will be omitted. Also, the word "memory" or "memory cells" used in the description below is to be taken to mean a memory of the present invention. In addition, although memories, such as an SRAM, flash memory, or EEPROM, are usually present on the same chip, the word "memory" will be used only to mean a gain cell memory of the present invention. Furthermore, elements whose functions are associated with one another between different embodiments will be assigned the same reference number, even if the elements differ in shape, impurity density, crystalline structure, and/or the like.

First Embodiment

First, a structural description of memory cells of the present invention is given below.

(Structural Description)

Figure 1A:
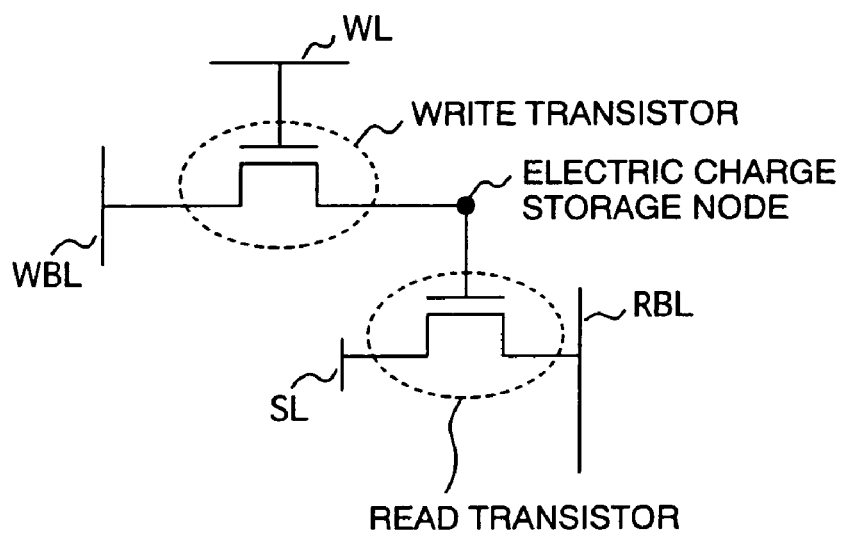
FIG. 1A is an equivalent circuit diagram that explains DRAM memory cells of a gain cell construction (for a two-transistor arrangement)
Figure 1B:
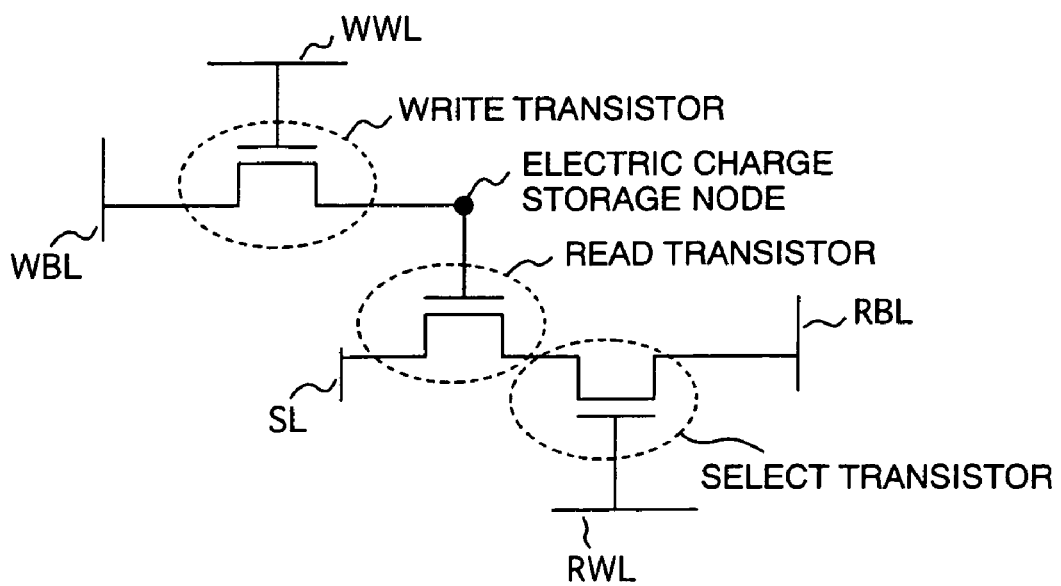
FIG. 1B is another equivalent circuit diagram that explains DRAM memory cells of a gain cell construction (for a three-transistor arrangement)
Figure 2:
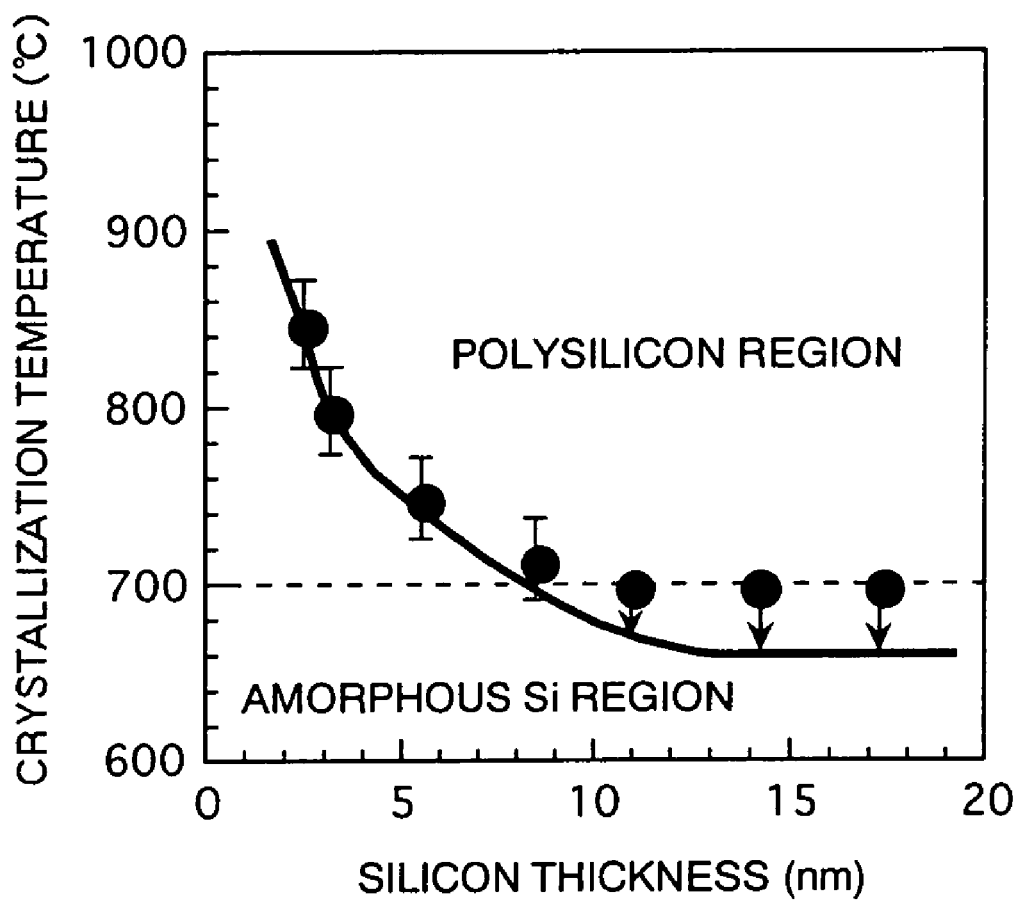
FIG. 2 shows experimental results of the relationship between the film thicknesses and crystallization temperatures of ultrathin amorphous silicon films.
Figure 3:
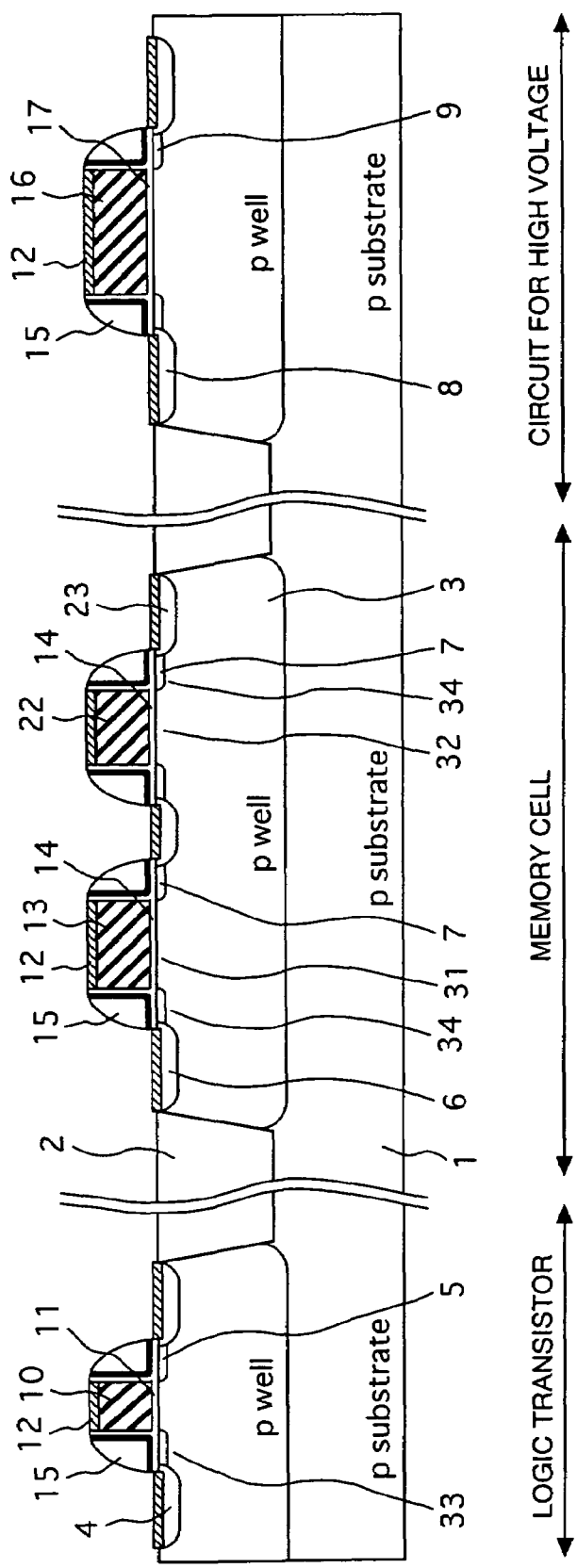
FIG. 3 is a sectional structural view explaining a construction of a semiconductor chip of a first embodiment.
Figure 4:
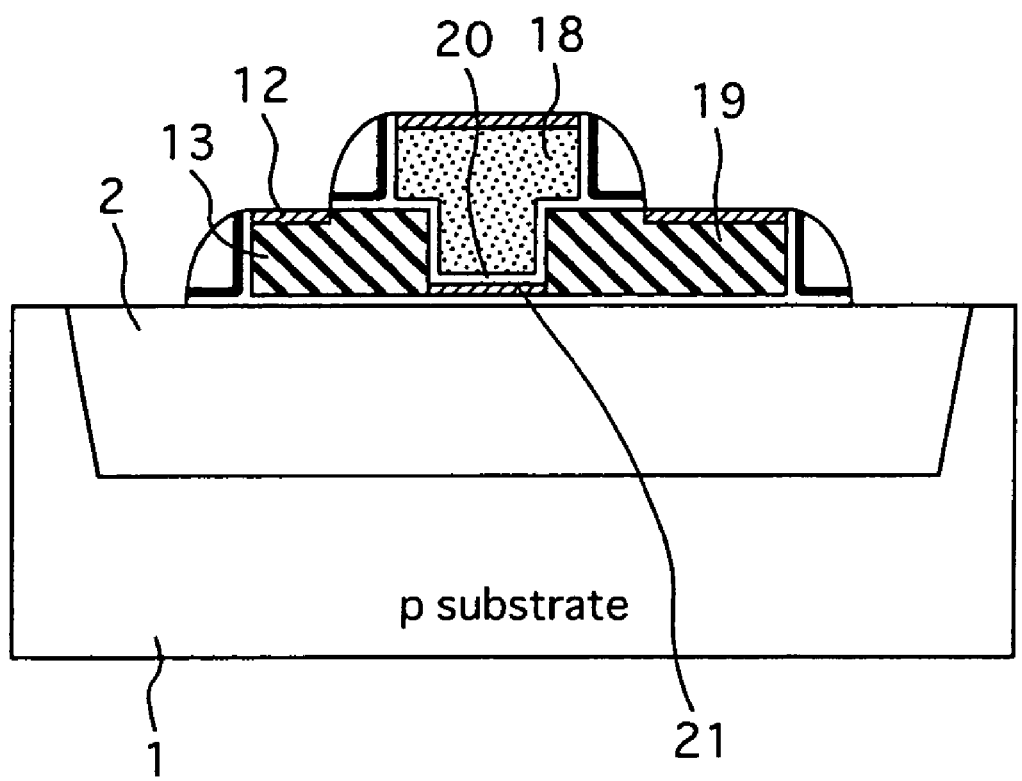
FIG. 4 is a sectional structural view explaining an internal write transistor structure within memory cells of the semiconductor chip of the first embodiment.
Figure 5:
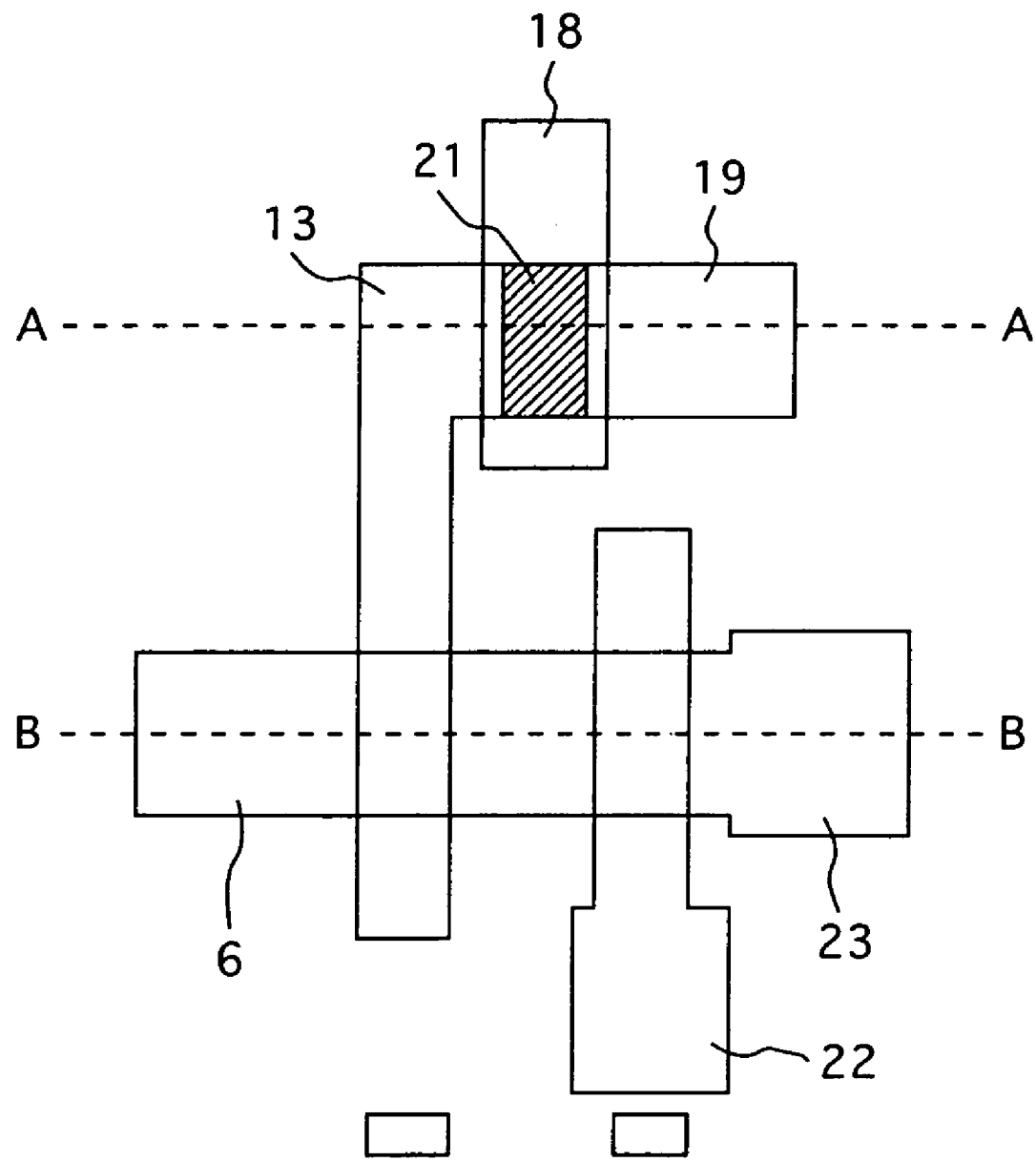
FIG. 5 is a top view explaining a construction of unit memory cells in the semiconductor chip of the first embodiment.
Figure 6A:
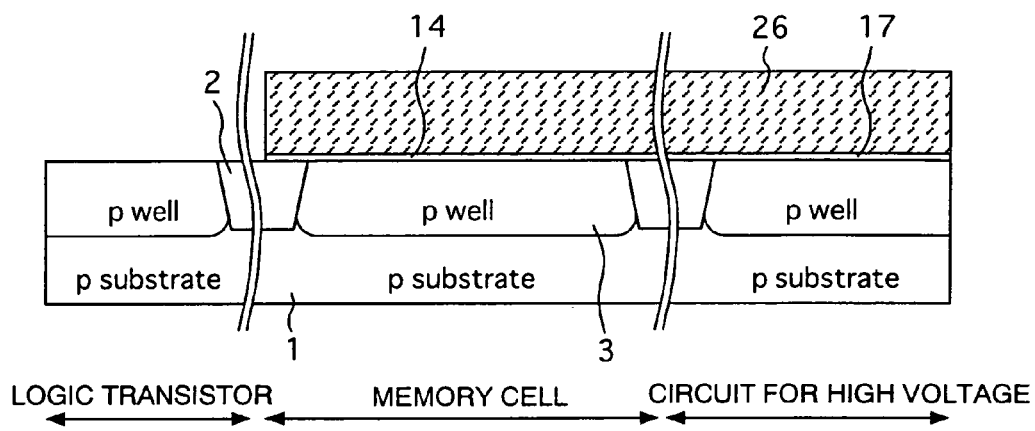
FIG. 6A is a sectional structural view explaining a manufacturing method for the semiconductor chip of the first embodiment.
Figure 6B:
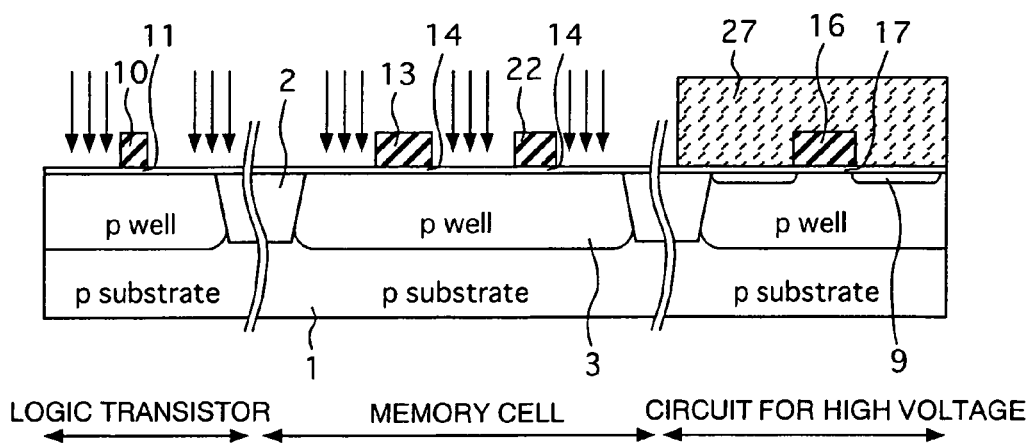
FIG. 6B is a sectional structural view explaining the manufacturing method for the semiconductor chip of the first embodiment.
Figure 7:
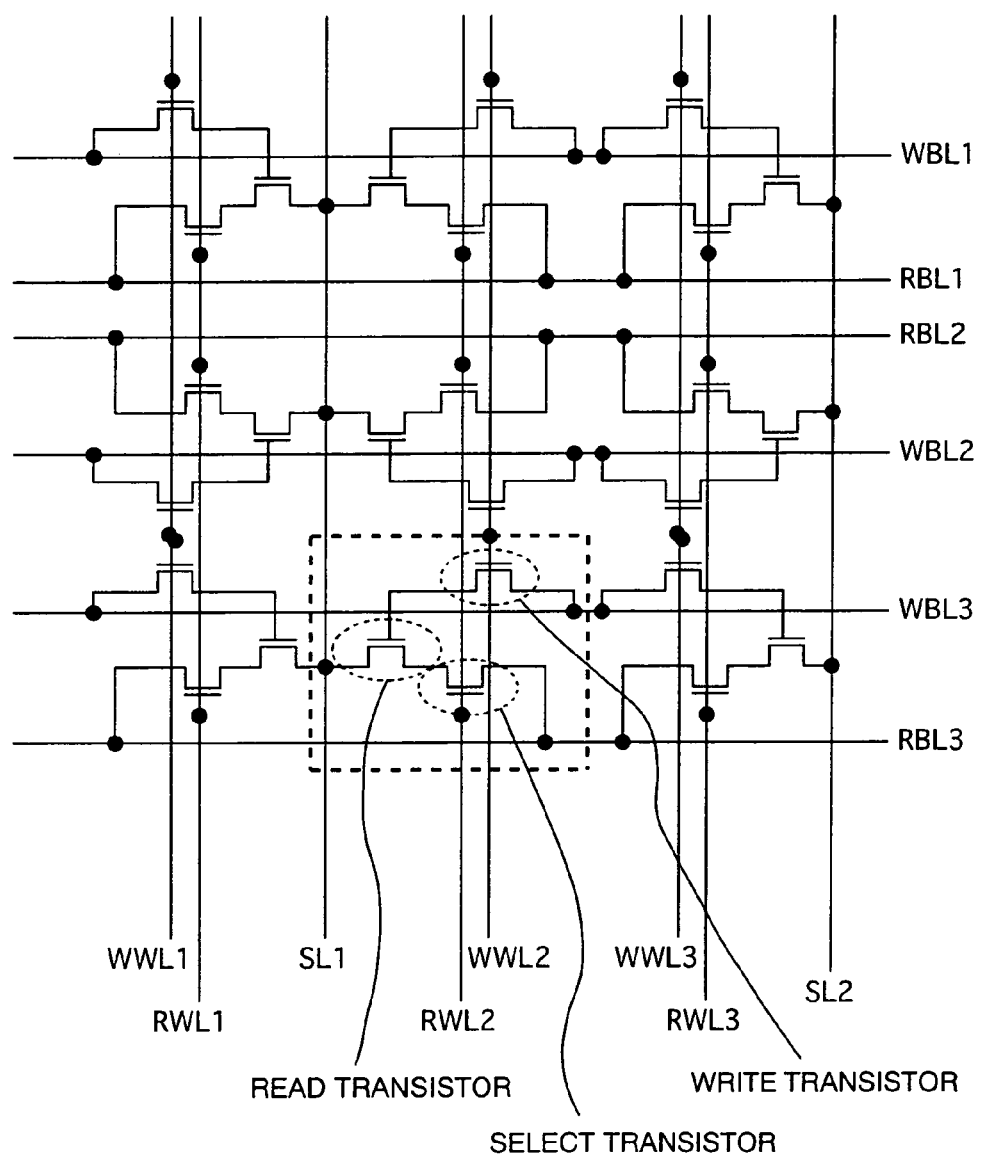
FIG. 7 is an equivalent circuit diagram that explains an internal memory cell array construction of the semiconductor chip of the first embodiment.

FIG. 3 is a sectional view showing in array form a logic transistor, a memory cell block, and a high-voltage transistor of a semiconductor chip according to a first embodiment. The memory cell block takes a three-transistor gain cell arrangement equivalent to that of FIG. 1B. FIG. 5 is a diagram showing a planar structure of the memory cell block. The memory cell block shown in section in FIG. 3 is equivalent to the section taken along line B-B of FIG. 5. A structure of the section taken along line A-A of FIG. 5 is shown in FIG. 4. FIGS. 6A and 6B are sectional views that explain manufacturing processes, and FIG. 7 is an equivalent circuit diagram explaining an array construction of the memory cell block. The portion boxed with a discontinuous line in FIG. 7 is equivalent to a unit memory cell. For the sake of convenience in description, the sectional views and plan views are shown with contact patterns and wiring omitted. Of the two types of three-transistor memory cell arrangements shown in FIGS. 1A and 1B, only the memory cell arrangement of FIG. 1B will be used in the present embodiment described below. However, a two-transistor memory cell arrangement of FIG. 1A may be used instead. The three-transistor arrangement has a feature in that since a select transistor is present, a sufficient readout margin can be obtained. The two-transistor arrangement is characterized in that because of its small cell area, LSI small in area, i.e., low in cost, can be realized.

A p-type well 3 and an n-type well (not shown) are formed on a semiconductor substrate 1 formed of p-type monocrystal silicon (hereinafter, this semiconductor substrate is referred to simply as the substrate). An element separation region 2 is a groove in the substrate, having an $SiO_2$ film embedded in the groove. Although the p-type well 3 assumes direct connection to the p-type substrate 1, the p-type well 3 may take a so-called triple-well structure having an n-type region in the p-type substrate 1 and further having a p-type region formed in the n-type region. The triple-well structure makes it possible to assign different voltages to the p-type wells separated from each other by the n-type region, and to apply a bias to the substrate. Gate-insulating films are each formed of $SiO_2$ subjected to nitriding, and two thickness levels, 2 nm and 7 nm, are provided for these films. A gate-insulating film 11 of the logic transistor is 2 nm thick, and gate-insulating films 14 of the memory cell block and a gate-insulating film 17 of the high-voltage transistor are each 7 nm thick. Gate electrodes 10, 13, 22, 16 of each transistor are each formed of the polycrystalline silicon having a surface treated with cobalt silicide 12 to reduce resistance. In this case, a gate length of the logic transistor is 70 nm, that of a read transistor in the memory cell block is 180 nm, that of a select transistor in the memory cell block is 120 nm, and that of the high-voltage transistor is 400 nm. The gate of the read transistor is longer than that of the select transistor. This is because the read transistor needs to ensure a fixed capacity in order for its gate to have a capacity appropriate for electric charge storage. There are no such restrictions on the select transistor, and it is desirable that the select transistor be formed into a higher-performance transistor using a gate as short as possible in the range where a short-channel effect does not become a problem. Also, respective gate electrode underparts 31, 32 of the read transistor and the select transistor differ in impurity density from each other and have thresholds different between both transistors. The advantageous effects produced by this difference are described later. Since the select transistor has a thick gate-insulating film as compared with the logic transistor, a gate longer than that of the logic transistor is basically used for the select transistor to ensure short-channel effect suppression. The gate electrodes of each transistor have a sidewall structure 15 formed up of $SiO_2$ and SiN. Shallow n-regions or extension regions 5, 7, 9 are provided under the sidewall structures.

Diffusion layers present under the sidewalls are occasionally called LDD, not extensions, and the word "LDD" is usually used for high-voltage MOS's, in particular. In the present specification, however, the diffusion layers will be described as extensions, without distinction from LDD.

Also, n+ regions 4, 6, 23, 8 are provided as source or drain regions externally to the sidewalls. The logic transistor uses an extension region shallower than that of the high-voltage transistor. This extension region is formed by low-energy impurity doping or by impurity diffusion from the surface, and the formation is intended to provide an extension structure that suppresses horizontal and vertical spreading of impurities and is strong against a short-channel effect even when the gate is short. In addition, the extension region of the logic transistor is higher than that of the high-voltage transistor in terms of impurity density.

Conversely, an extension region formed by higher-energy impurity doping and more spread both vertically and horizontally is provided for the high-voltage transistor to ensure a sufficient PN junction withstand voltage. One factor characterizing the present embodiment exists in depth of each extension region of the memory cell block. Although the memory cell block uses the gate-insulating films having the same thickness (7 nm) as that of the logic transistor, the memory cell block uses an extension structure as shallow as that of the logic transistor. In actuality, the extensions in the memory block are slightly shallower than the extension of the logic transistor. This is due to a difference in film thickness between the gate-insulating films that are to be passed through during the later-described manufacturing processes when the logic transistor and the memory cell block are doped with impurities at the same time. Use of such shallow extensions provides excellent short-channel characteristics and thus allows gate lengths to be reduced below the gate length of the high-voltage transistor and a smaller memory cell area to be achieved. In addition, as described later, the voltages applied to the read transistor and to the select transistor are small and therefore a particularly high junction withstand voltage is not required. The read transistor has a thicker gate-insulating film than the logic transistor. This allows storage by storing an electric charge into the gate, and prevents storage/release of an electric charge due to a tunneling current via the gate-insulating film. In the present embodiment, a gate-insulating film thickness common to that of the high-voltage transistor is used to minimize manufacturing process steps. However, since a film thickness of at least 3 nm suffices in terms of current leakage from the gate-insulating film, three-level gate-insulating film construction may be adopted by, for example, providing a separate 4-nm-thick gate-insulating film for the memory cell block. In this case, the extension structure used will also be the same structure as that of the logic transistor. Transistors excellent in short-channel characteristics can thus be formed. Since the gate-insulating films in the memory cell block are thinner than the gate-insulating film of the high-voltage transistor, it is possible to further improve short-channel characteristics, to use shorter gate length, and to achieve a smaller cell area. Also, the read transistor and the select transistor increase in gate capacity, and a readout speed improves. Additionally, the amount of charge stored increases, which allows stable operation and a longer hold time to be realized. Furthermore, since subthreshold coefficients are lowered, readout margins are improved by significant readout current changes with respect to the same amount of charge stored.

Next, the write transistor is described. A source region 13 and drain region 19 of the write transistor function as an electric charge storage node and a write bit line, respectively, and the source region 13 functions intact as the gate electrode of the read transistor. The write transistor here plays a role of a pass transistor, and depending on a bias relationship, the functions of the source and the drain become opposite. For simplicity, however, the source and the drain are called with fixed names here. Both the source region 13 and the drain region 19 are formed of a 150-nm-thick n-type polycrystalline silicon and connected by a 2.5-nm-thick, non-doped, ultrathin polycrystalline silicon film. Also, this ultrathin polycrystalline silicon film permits control of potential by a gate electrode 18 made of an n-type polycrystalline silicon film, via a 15-nm-thick $SiO_2$ film 20. The gate electrode 18 is connected to a write word line. The source 13, drain 19, and gate electrode 20 are surface-silicidized with cobalt silicide, and each has a sidewall structure. The write transistor of this FET structure features a very small leakage current. The present inventors conducted their own close studies to find that a remarkable leakage reduction effect can be obtained with a film thickness of 5 nm or less. This effect is considered to be due to the fact that a cross-sectional area of the film is very small in comparison with a PN junction area of a normal transistor, and in addition, due to the fact that a band gap is effectively spread by a quantum-mechanical confinement effect in a film-thickness direction.

(Operational Description)

Memory operation according to the present embodiment will be described.

Write operation is described first. A write bit line potential is set to "High" (e.g., 1 V) or "Low" (e.g., 0 V), depending on information to be written. Next, a write word line voltage is increased from a hold potential (e.g., −0.5 V) to a write potential (e.g., 2 V). Thus, the write transistor is turned on and the potential that has been set for the write bit line is written into a storage node 13. The write operation is subsequently completed by returning the write word line voltage to the hold potential. During the write operation, a potential of diffusion layer 6 of the read transistor is desirably fixed. This potential is fixed at 0 V in the present embodiment. Turning off the select transistor by assigning a low potential (e.g., 0 V) to a readout word line 22 that is the gate electrode of the select transistor minimizes any effects of changes in a potential of the readout bit line during the write operation.

Readout operation is described next. The readout operation is conducted with the write word line voltage remaining set to be equal to the hold potential (e.g., −0.5 V). First, a desired precharge voltage (e.g., 1 V) is assigned to the readout bit line and the source 6 of the read transistor is fixed at a desired potential (e.g., 0 V). When the select transistor is turned on by assigning a high potential (e.g., 1 V) to the readout word line 22 that is the gate electrode of the select transistor, a current flows between a readout bit line 23 and the source 6 of the read transistor. As a result, although the potential of this readout bit line changes, conductance of the read transistor differs according to the information stored therein, and thus the potential of the readout bit line differs in rate of change. Readout can be conducted by starting in desired timing a sense amplifier connected to the readout bit line, and amplifying a magnitude of the above potential with respect to a reference potential. When the relationship between potentials, mentioned here, is used, conducting a "High" write operation during writing accelerates a decrease in the potential of the readout bit line, thus resulting in this potential being regarded as "Low" and correspondingly amplified. The "Low" potential at which the information has been written is amplified to a "High" potential. It is to be noted, therefore, that the "High"/"Low" relationship during the write operation is inversed during the readout operation. This operation is basically a nondestructive readout operation and differs from a single-transistor single-capacitor type of DRAM operation. A design that makes readout disturbance ignorable may be conducted so that reading is followed by rewriting.

Refresh operation is described next. In the present embodiment, the refresh operation is conducted at intervals of 256 ms. The memory cell driven by a selected readout word line is read out first. Next, reversal information on amplification information of that line is loaded onto a bit line and then a write operation is conducted using a write word line associated with an original line. This makes refreshing possible. The entire memory cell array can be refreshed by selecting word lines in sequence and repeating this operation.

(Manufacturing Method)

Next, a method of manufacturing an LSI chip according to the present embodiment will be described using FIGS. 6A and 6B.

First, the surface of a P-type silicon substrate 1 is oxidized and after deposition of an SiN film, a groove is formed by etching the SiN film, an $SiO_2$ film, and silicon, with a resist as a mask. After this, the groove is filled in with a CVD-$SiO_2$ film, then the surface is made planar, and an element separation region 2 and an active region are formed on the substrate 1. Next, an n-type well and a p-type well 3 are formed by ion implantation of impurities. Impurity implantation for threshold adjustment is followed by gate oxidation to obtain a thickness of about 6 nm. A treatment with hydrofluoric acid is conducted with, as a mask, a resist pattern 26 having an open end at a logic transistor block. A gate-insulating film formed at the open end is thus removed (see FIG. 6A). A pattern without an open end is used for a memory cell block. Resist removal is followed by 2-nm-thick gate oxidation. At a high-voltage transistor block, the first amount of oxidation is adjusted beforehand for the total thickness of 7 nm obtained by the first oxidation and the second oxidation that followed resist removal. Next, a non-doped polycrystalline silicon film for a 150-nm-thick gate electrode is deposited. Implantation of n-type impurities into the region where an n-type gate is to be formed, and into the memory cell block, is conducted with respective resists as masks. After this, a groove for channel definition of a write transistor is formed by etching part of its polycrystalline silicon with a resist as a mask. The formation of the groove is followed by deposition of a 2.5-nm-thick amorphous silicon film and a 15-nm-thick $SiO_2$ film, and a source, drain, and channel of the write transistor and a gate electrode of a read transistor are formed by processing each with a resist as a mask. Furthermore, a 50-nm-thick n-type polycrystalline silicon film is deposited and annealing at 850° C. follows, thereby crystallizing the amorphous silicon film. Next, a gate electrode of the write transistor is formed by processing n-type polycrystalline silicon using the appropriate resist as a mask. Next, a P-type impurity is implanted into the region where a P-type transistor is to be formed, and implantation of an impurity into a gate electrode of the P-type transistor and adjustment of its threshold are further conducted. This is followed by etching that uses resists as respective masks, and gate electrodes of peripheral circuits which include a logic block and the high-voltage transistor are thus formed. An impurity is further implanted using a resist as a mask to form an extension of n-type high-voltage transistor. In the present embodiment, $10^{13}$ arsenic (As) ions per square inch are implanted into an nMOS at 40 keV. Next, an impurity is implanted with a resist as a mask to form an extension of p-type high-voltage transistor. This transistor is doped with $10^{13}$ $BF_2$ ions per square inch at 40 keV. Next, implantation of n-type impurities into the high-voltage transistor block and into the memory cell block is conducted with respective resists as masks to form extensions (see FIG.

6B). Implantation of $10^{14}$ As ions per square inch at 4 keV is conducted using, as a mask, a resist pattern 27 that covers the high-voltage transistor and the p-type transistor block. Subsequently, $10^{13}$ boron (B) ions per square inch are implanted as a p-type impurity into deeper positions at 10 keV in order for p-type well densities at extension underparts 33, 34 to increase for prevention of punch-through. Furthermore, p-type impurity implantation with, as its mask, a resist pattern that covers the high-voltage transistor block and the n-type transistor block, is conducted to form an extension in a pMOS formation region of the logic block. More specifically, $10^{14}$ $BF_2$ ions per square inch are implanted at 3 keV. Additionally, $10^{13}$ As ions per square inch are implanted as an n-type impurity into deeper positions at 40 keV in order for n-type well densities at extension underparts to increase for prevention of punch-through. After subsequent deposition of a CVD-$SiO_2$ film, an SiN film, and a CVD-$SiO_2$ film, a sidewall is formed on a side of each gate electrode by etching-back. Diffusion layers are formed by implanting an n-type impurity into the nMOS region and a p-type impurity into the pMOS region, with the sidewall and the resist as masks. These impurity implantation operations for the diffusion layers employ impurity implantation process steps common to the read transistor and select transistor of the memory cell block. Use of such impurity implantation process steps as mentioned above allows manufacturing costs to be reduced without ever having to provide a special mask or process for the formation of the extensions and diffusion layers of the memory cell block.

The final extension structure that includes thermal process steps is such that in the logic transistor and both the read and select transistors of the memory cell block, a density of As at a depth of 5 nm from an interface between the gate-insulating film and the silicon substrate becomes about $5 \times 10^{19}$ ions per cubic centimeter. Also, the junction depths directly under the extensions, when measured at the interface between the gate-insulating film and the silicon substrate, are 22 nm for the logic transistor and 18 nm for the read and select transistors of the memory cell block. For a 3.3-V high-voltage MOS, a density of As at a depth of 5 nm from the interface between the gate-insulating film and the silicon substrate becomes about $1 \times 10^{18}$ ions per cubic centimeter, the density of which is lower than the above by about one order of magnitude. Also, the junction depths directly under the extensions, when measured at the interface between the gate-insulating film and the silicon substrate, are about 60 nm, which is more than twice the junction depths of the above case.

Subsequently, Co (cobalt) is deposited by sputtering, then annealed for reaction on the silicon, and removed. At this time, not only portions of a gate electrode upper face and source-drain region of the write transistor in the memory cell block, but also the read transistor and the select transistor are silicidized. Additionally, insulating film deposition and planarization are followed by a contact formation process, a via formation process, and a wiring process. Wiring for only the necessary number of layers is provided by repeating through-hole formation, via formation, and wiring formation.

While the present invention has used a combination of an n-type write transistor and n-type read and select transistors, this can be replaced by combining each transistor of different polarity or combining p-type transistors. Even in these combinations, the same applies in that as described above, both the read transistor and the select transistor use the same extension or diffusion layer as that of the logic transistor.

Since the write transistor is formed on an insulating film, there is no need to form a well, so that different polarity can be used without an increase particularly in area. Selection of different polarities between the write transistor and the read and select transistors is effective when capacity coupling between the gate electrode of the write transistor and that of the read transistor cannot be ignored. For n-type write and read transistors, for example, when a write operation is completed, a gate electrode potential of the write transistor lowers from a high potential to a hold potential. At this time, since the electric charge storage node is also lowered in potential by capacity coupling, the read transistor could increase in resistance. In the present embodiment, therefore, the read transistor has its threshold value set to be lower than that of the select transistor, whereby a sufficient readout current can be obtained even when capacity coupling takes place. The select transistor is not affected by above-mentioned capacity coupling, and in terms of off-leakage current suppression of the non-select memory cell, it is preferable that a threshold of the select transistor should rather not be lowered too significantly. This means that the threshold of the read transistor is preferably lower than that of the select transistor. If the polarity of the write transistor and that of the read transistor are opposite to each other, however, such capacity coupling has the characteristic that it increases the readout current. For example, when an n-type write transistor and p-type read and select transistors are used, there is no need, unlike a case in which all three transistors used are of the n-type, for the read transistor to have a threshold at which the transistor turns on more easily than the select transistor (i.e., for the p-type, higher voltage with a sign). In other words, it is preferable that the threshold of the read transistor be the same value as, or lower than, the threshold of the select transistor (i.e., for the p-type, lower voltage with a sign). As a result, a resistance rate of the read transistor according to the information held increases and this, in turn, provides greater readout margins. In this case, since the charge storage node takes n-type characteristics near the write transistor, and p-type characteristics near the read transistor, although a p-n junction is established in this context, these transistors are electrically connected to each other by the silicide on the surface. Also, the read transistor and the write transistor are preferably of the same polarity. The p-type write transistor, although small in turn-on current, is excellent in hold characteristics because of its small turn-off current also. In addition, use of a p-type read transistor gives the feature that it is small in gate-insulating film leakage current compared with a p-type read transistor, even at the same gate-insulating film thickness. Furthermore, while the present embodiment has assumed a p-type substrate, an SOI (Silicon on Insulator) substrate may be used instead. Use of an SOI substrate improves the logic transistor in characteristics, thus making it possible to achieve LSI faster in operation and lower in electric power consumption. Moreover, the present embodiment has employed surface-silicidized polycrystalline silicon as gate electrodes, and $SiO_2$ films as gate-insulating films. However, the diffusion layer structure and gate-insulating film combinations described above are effective, even if metallic gate electrodes and hafnium oxide, alumina, or other highly dielectric films are used as gate-insulating films. In this case, the relationship in magnitude of thickness between the gate-insulating films would be understandable by rereading the film thicknesses expressed in electrical $SiO_2$ film thickness, not in physical film thickness. For instance, when a highly dielectric film and an $SiO_2$ film are mixedly present as gate-insulating films, the relationship mentioned in the present embodiment is effective intact. This can be made obvious by, first, converting the film thickness of the highly dielectric film into the $SiO_2$ film thickness that gives equivalent capacitance, by use of a dielectric constant of the highly dielectric film, and then if the converted value is smaller than the actual $SiO_2$ film thickness, construing the highly dielectric film as a thinner gate-insulating film. The above also applies to other embodiments.

Second Embodiment

Figure 8:
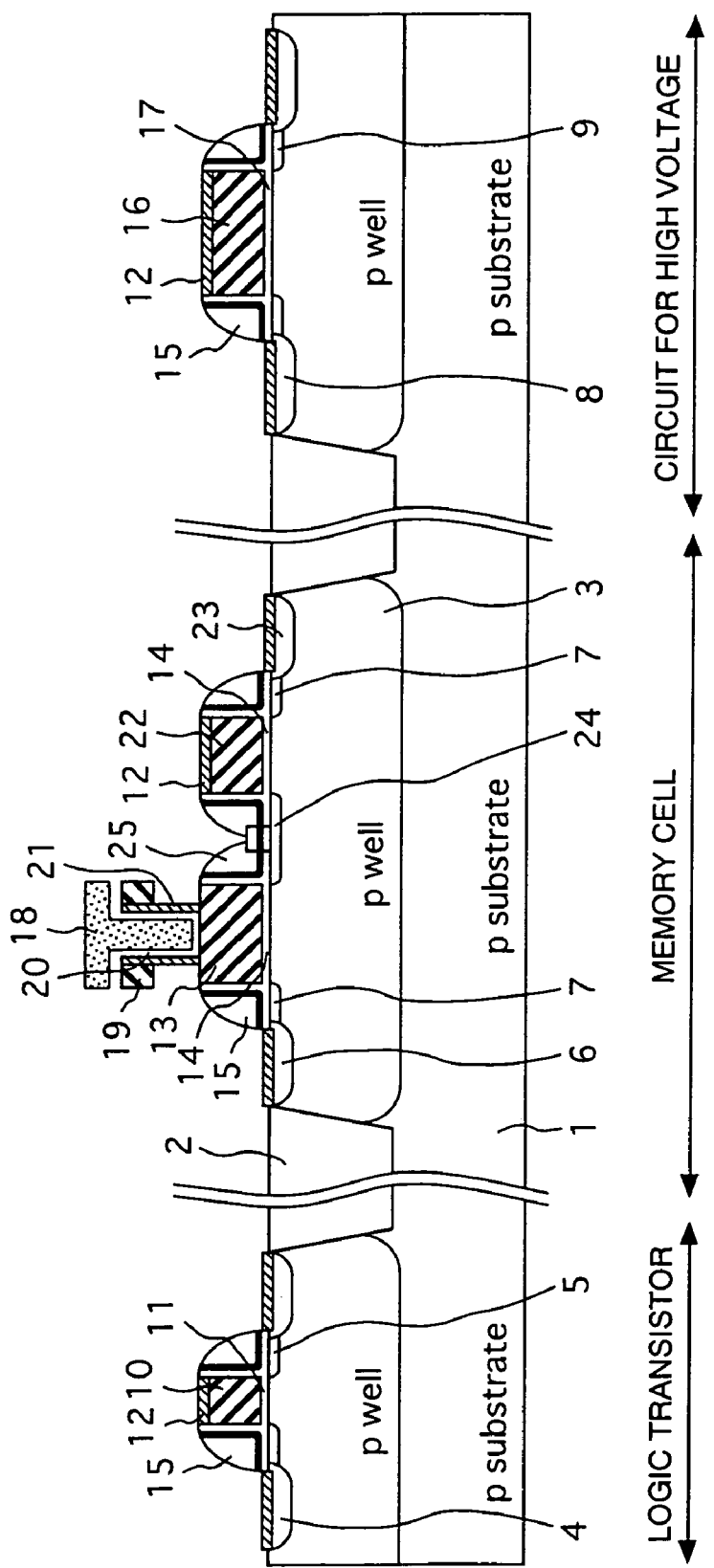
FIG. 8 is a sectional structural view explaining a construction of a semiconductor chip of a second embodiment.
Figure 9:
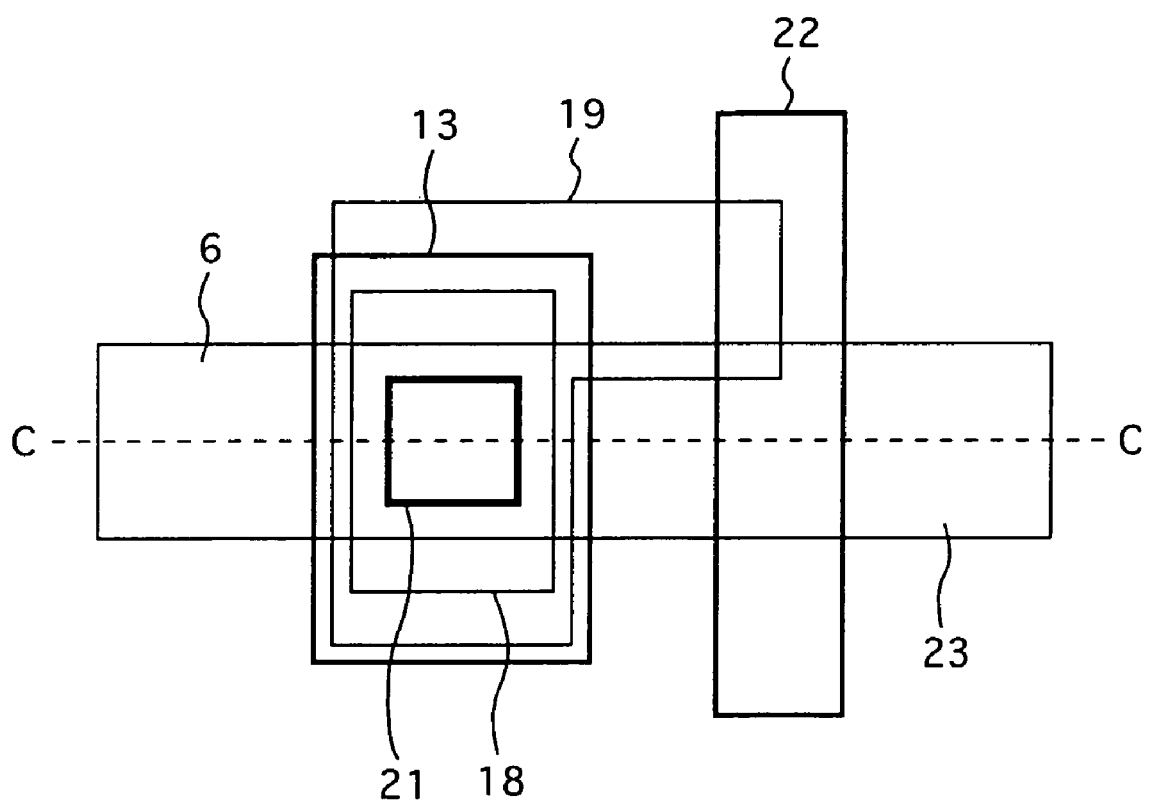
FIG. 9 is a top view explaining a construction of unit memory cells in the semiconductor chip of the second embodiment.

FIGS. 8 and 9 show a second embodiment of the present invention. FIG. 8 is a sectional view showing in arranged form a logic transistor, a memory cell block, and high-voltage transistor of a semiconductor chip according to the present embodiment. FIG. 9 is a top view of the memory cell block, section C-C of which is associated with a memory block of FIG. 8. In terms of equivalent circuit composition and operation, the present embodiment is the same as the first embodiment. Only differences between both embodiments are described below. The first difference exists in that a stereographic structure is employed for a write transistor. The present embodiment is characterized in that because of the stereographic structure being employed, the write transistor is formed directly above a read transistor and this arrangement results in a very small memory cell area. This write transistor of the stereographic structure has a channel film 21 made of the 3-nm-thick non-doped ultrathin amorphous silicon formed on a side of a hole. This hole passes through write-bit line polycrystalline silicon and an $SiO_2$ film present thereunder, and reaches an electric charge storage node 13, a gate electrode of the read transistor. The $SiO_2$ film formed internally to the channel film is a gate-insulating film, and the polycrystalline silicon formed in such a way as to fill in a hole present internally to the gate-insulating film forms a gate electrode 18. This structure features not only a small cell area, but also a small parasitic capacity between the gate electrode 18 of the write transistor and the electric charge storage node 13, and hence, a great readout operation margin. The present embodiment also differs from the first embodiment in that ultrathin amorphous silicon is used in the channel of the write transistor. Since this structure has the write transistor formed on a transistor previously formed on a substrate surface, it is natural to adopt fabrication processes in which the logic transistor is formed before the write transistor is formed. As mentioned in the description of the problems which the present invention is to solve, the present inventors conducted their own studies to find that ultrathin amorphous silicon films as thin as 5 nm or less increase in crystallization temperature. At least several minutes of annealing at 800° C. or more is therefore required for crystallization, but annealing at these temperatures coagulates cobalt silicide and spreads extensions. The present inventors considered adopting a structure not involving crystallization. As a result, it was found that for the same channel film thickness, although using amorphous silicon diminishes a turn-on current more significantly than using a polycrystal, the former method also reduces a turn-off current. Sufficient characteristics can therefore be obtained by using a film thicker than a polycrystal. For this reason, the structure in the present embodiment employs amorphous silicon, thus allowing reduction of a thermal load on the transistor earlier formed. In the present embodiment, an interspace between the gate electrode of the read transistor and that of the select transistor is narrowly formed for minimum memory cell area. The interspace in the present embodiment is 150 nm wide. This width of the interspace is smaller than twice the 90-nm sidewall width used in the present embodiment, and thus, sidewalls 25 of both the read transistor and the select transistor take a connected form. Bodies of both transistors, therefore, are connected at respective extensions 24 formed shallowly, not at diffusion layers formed in respective n+ regions. The present invention does not require forming a contact between the two transistors, and makes it possible to achieve small memory cells not causing any electrical problems because of the above transistors being connected at the shallow extensions.

Manufacturing process steps for the present embodiment are described next. One of major differences in manufacturing process is that whereas the write transistor in the first embodiment is formed before a logic transistor and high-voltage transistor thereof are formed, the write transistor in the present embodiment is formed after the formation of other transistors.

First, the surface of a P-type silicon substrate 1 is oxidized and after deposition of an SiN film, a groove is formed by etching the SiN film, an $SiO_2$ film, and silicon, with a resist as a mask. After this, the groove is filled in with a CVD-$SiO_2$ film, then the surface is made planar, and an element separation region 2 and an active region are formed on the substrate 1. Next, an n-type well and a p-type well 3 are formed by ion implantation of impurities. Impurity implantation for threshold adjustment is followed by gate oxidation to obtain a thickness of about 6 nm. A treatment with hydrofluoric acid is conducted with, as a mask, a resist pattern having an open end at a logic transistor block. A gate-insulating film formed at the open end is thus removed. A pattern without an open end is used for a memory cell block. Resist removal is followed by 2-nm-thick gate oxidation. At a high-voltage transistor block, the first amount of oxidation is adjusted beforehand for the desired total thickness of 7 nm obtained by the first oxidation and the second oxidation that followed resist removal. Next, a non-doped polycrystalline silicon film for a 150-nm-thick gate electrode, and a 30-nm-thick $SiO_2$ film are deposited. Implantation of an N-type impurity and a P-type impurity into the region where an N-type transistor is to be formed, and the region where a P-type transistor is to be formed, respectively, is conducted with respective resists as masks. After this, impurities are implanted into gate electrodes of the N-type and P-type transistors and then thresholds of these transistors are adjusted. Subsequently, gate electrodes of peripheral circuits which include a logic block and the high-voltage transistor are formed by etching that uses resists as respective masks. An impurity is further implanted using a resist as a mask to form an extension of the n-type high-voltage transistor. In the present embodiment, phosphor (P) is implanted into an nMOS at 10 keV. Next, an impurity is implanted with a resist as a mask to form an extension of p-type high-voltage transistor. This transistor is doped with $BF_2$ at 5 keV. Next, implantation of an n-type impurity into nMOS formation region of the logic block and into the memory cell block is conducted with respective resists as masks to form extensions. Arsenic (As) is implanted into these blocks at 3 keV. Subsequently, a p-type impurity is implanted into deeper positions in order for p-type well densities at extension underparts to increase for prevention of punch-through. Furthermore, a p-type impurity is implanted to form an extension in pMOS formation region of the logic block. More specifically, $BF_2$ is implanted at 3 keV. Additionally, an n-type impurity is implanted into a deeper position in order for the n-type well density at an extension underpart to increase for prevention of punch-through. After subsequent deposition of a CVD- SiO$_2$ film, an SiN film, and a CVD-SiO$_2$ film, a sidewall is formed on a side of each gate electrode by etching-back. Diffusion layers are formed by implanting an n-type impurity into the nMOS region and a p-type impurity into the pMOS region, with the sidewall and the resist as masks. These impurity implantation operations for the diffusion layers employ impurity implantation process steps common to the read transistor and select transistor of the memory cell block. After this, S$_i$O$_2$ film etching with, as its mask, the resist pattern that covers a gate electrode polycrystalline silicon block not to be silicidized, is conducted to expose the polycrystalline silicon film existing in the block which is to be silicidized. At this time, although the polycrystalline silicon forming the gate electrode of the select transistor in the memory cell block is exposed, the surface of the polycrystalline silicon forming the gate electrode of the read transistor is not exposed and the surface of a resistive element block to be formed using a polycrystalline silicon pattern is not exposed, either. Subsequently, Co (cobalt) is deposited by sputtering, then annealed for a reaction on the silicon, and removed. A non-silicidized pattern is formed in the read transistor and the resistive element block as a result. Subsequently, a 120-nm-thick SiO$_2$ film is deposited and then 40-nm-thick n-type polycrystalline silicon and a 30-nm-thick SiO$_2$ film are deposited. Such a channel hole of the write transistor that passes through the SiO$_2$ film, the n-type polycrystalline silicon, and the SiO$_2$ film, and reaches the gate electrode of the read transistor, is formed by processing with resists as masks. At this time, if the read transistor to operate as the electric charge storage node has a silicidized surface, the possible significant effects on electrical characteristics that depend on the amount of chipping of the silicide could result in the characteristics becoming nonuniform between elements among wafers and inside the wafers. In the present invention, therefore, the transistor surface is not silicidized to avoid the above problem and thus to realize memory cells uniform in characteristics. The above problem may likewise be avoidable by silicidizing the surface of the read transistor and forming the channel-forming hole thereof in such a form as to penetrate the hole. There are no such restrictions for the select transistor, and it is desirable that when the gate electrode of the select transistor is to be used as local wiring, in particular, the surface of the select transistor should be silicidized. If the gate electrode of the read transistor is not silicidized and only the select transistor is silicidized, a problem will occur between the two transistors. This is because, if a diffusion layer exists between the two transistors, silicidizing only of one portion, dependent on matching accuracy of lithography during SiO$_2$ etching for surface exposure, will become a causative factor in yielding the uniformity of characteristics between memory cells. In the present invention, however, between the two transistors, the substrate surface is covered with interconnected sidewalls and this avoids the above causative factor. Additionally, a 3-nm-thick amorphous silicon film, a 15-nm-thick SiO$_2$ film, and an n-type polycrystalline silicon film are deposited. After this, the gate electrode of the write transistor that is to be connected to a write word line, and the drain region of the write transistor that is to be connected to a write bit line are processed using respective resists as masks. Next, insulating-film deposition and planarization are followed by a contact formation process, a via formation process, and a wiring process. Wiring for only the necessary number of layers is provided by repeating through-hole formation, via formation, and wiring formation.

Third Embodiment

Figure 10:
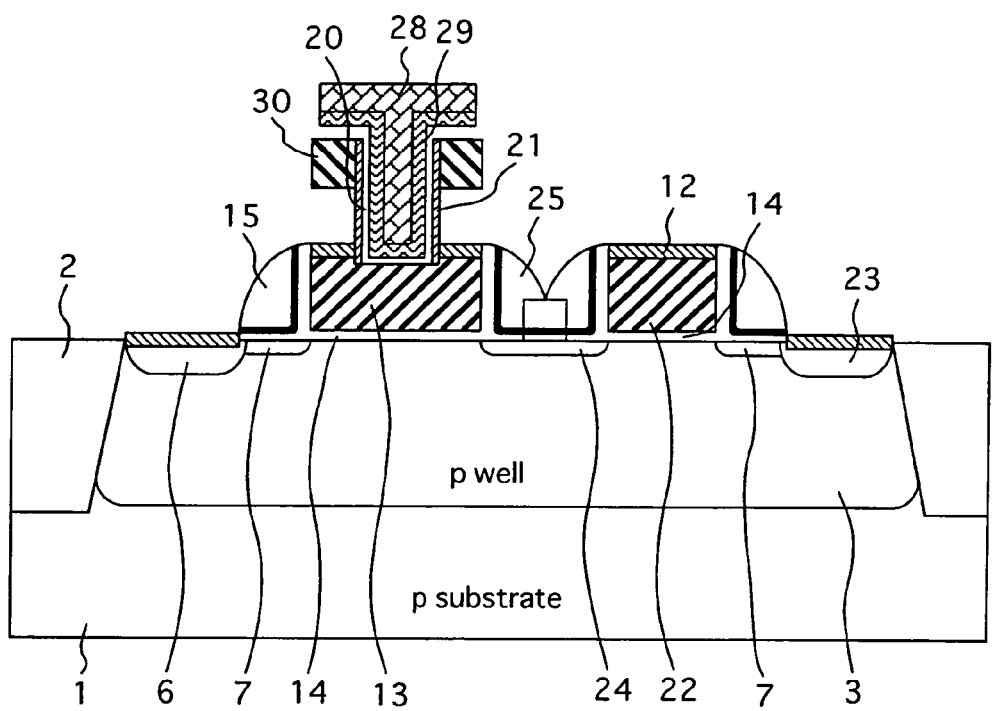
FIG. 10 is a top view explaining a structure of memory cells in a semiconductor chip of a third embodiment.

FIG. 10 shows a third embodiment of the present invention. The present embodiment differs from the second embodiment only in the kinds of transistor-silicidizing material and write transistor-constituting materials. The differences from the second embodiment are described below. First, the present (third) embodiment uses nickel (Ni) as a silicidizing material. Except in special places, therefore, nickel silicide is present on a gate surface 12 and a diffusion layer surface. Nickel silicide has the features in which it is low in resistance compared with a cobalt silicide and enables uniform silicide patterns to be prepared even for fine gate electrode patterns. At the same time, however, it is also known that nickel silicide, because of its low thermal resistance, increases in resistance when qualitatively modified by annealing at about 600° C. Accordingly, if a transistor is processed using nickel silicide and then the write transistor structure as described in the second embodiment is formed, deposition of a polycrystalline silicon film by CVD becomes a problem. In the present invention, therefore, tungsten (W) is used to form upward removal regions 30 of a write transistor. Also, the write transistor has its gate electrode formed into a stacked structure with titanium nitride (TiN) 29 and tungsten (W) 28. In addition, a gate electrode 13 of a read transistor has a silicidized surface, and a hole pattern for forming a channel along inner side faces has a hole bottom that penetrates the silicidized surface and reaches polycrystalline silicon. The gate electrode is formed into a stacked structure to adjust a threshold of the write transistor by using TiN on a side opposite to the channel silicon. According to studies by the present inventors, when a gate electrode is formed of n-type polycrystalline silicon as in the first or second embodiment, the threshold obtained is too low for 0-volt hold. Hold characteristics can therefore be improved by using a negative voltage as the write word line voltage for hold. Electric power consumption in a power supply block, however, increases correspondingly since the negative voltage needs to be maintained even during a stand-by state. It was also found that when a gate electrode is formed using P-type polycrystalline silicon, the threshold obtained is slightly too high, and thus that hold characteristics can be improved by using a positive voltage as the write word line voltage for hold. Additionally, it was found that forming a gate electrode using the TiN that has a work function somewhere in between those obtained by using the above two types of silicon enables appropriate hold characteristics to be obtained at an approximate hold voltage of 0 V. Electric power consumption during stand-by can therefore be further reduced. This relationship holds for practically any kind of transistor having a non-doped ultrathin silicon film in a channel, and the relationship holds, irrespective of the shape of the source, drain, or gate of the particular transistor. Since a drain region of W is used, a connection with the semiconductor functions as a Schottky barrier to suppress a leakage current even if a PN junction is absent. The same also applies when other kinds of metals are used. In addition, at a lower portion of the write transistor, although the channel film directly abuts on the nickel silicide, providing a hole that passes therethrough brings the channel film into contact with an n+ region. Therefore, diffusion of an n-type impurity into the channel film by subsequent heat treatment allows a junction to be formed at a position above a face that abuts on the nickel silicide. Thus, the channel film is not affected. The same also applies when cobalt silicide is used. A write transistor can be formed at low temperature by adopting the construction described above.

Fourth Embodiment

A fourth embodiment of the present invention will be described. The present embodiment differs from the first embodiment only in a diffusion layer structure of a read transistor of a memory cell block. The present embodiment is characterized in that in formation of read transistor and select transistor diffusion layers of the memory cell block, impurity implantation into shallow extension regions under gate sidewalls is conducted independently of, not simultaneously with, impurity implantation into a logic transistor, and with higher energy than for the logic transistor. In the first embodiment, since impurities are implanted through insulating films thicker than for the logic transistor, the quantities of impurities implanted lessen and the resistance of the extension of the read transistor in the memory cell block increases above the resistance of the logic block. However, the optimum quantities of impurities can be implanted into the optimal positions if the impurities are implanted independently and with higher energy. In the first embodiment, $10^{14}$ As ions per square inch are implanted at 3 keV to form the extension of the nMOS of the logic block, whereas, in the present embodiment, $10^{14}$ As ions per square inch are implanted into the memory cell block at 5 keV. Consequently, a density distribution of the impurity implanted not only peaks at a deeper position, but also spreads more significantly. However, since both the read transistor and select transistor in the memory cell block are greater than the logic transistor in terms of gate length, there is no concern over punch-through, even in consideration of the former transistors having a thicker gate-insulating film. Even in this case, the present embodiment is the same as the first embodiment in that compared with a high-voltage transistor for I/O, the read transistor and the select transistor have a shallow extension and is great in impurity density. It is necessary to use a photomask independent of that used during impurity implantation into the extension of the logic transistor. Compared with the high-voltage transistor for I/O, however, the read transistor and the select transistor are excellent in short-channel characteristics and can therefore use short gates. For these reasons, the present embodiment yields advantageous effects similar to those of the first embodiment in that a smaller cell area can be achieved and in that chip costs can be correspondingly reduced.

Fifth Embodiment

Figure 11:
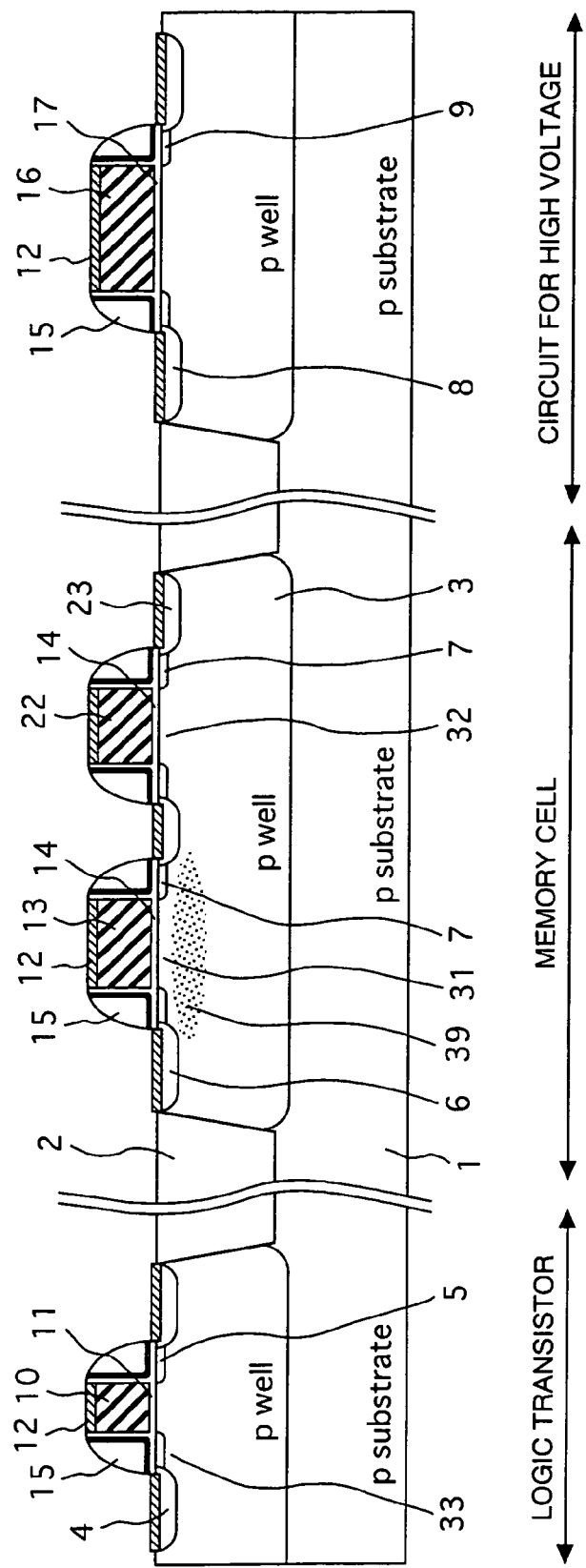
FIG. 11 is a sectional structural view explaining a construction of a semiconductor chip of a fifth embodiment.

FIG. 11 shows a fifth embodiment of the present invention. The present embodiment differs from the first embodiment only in substrate density under a read transistor gate of a memory cell block. The present embodiment is the same as the first embodiment in that a read transistor and select transistor of the memory cell block use different thresholds. When an N-type of write transistor and an n-type of read transistor are used, the threshold of the read transistor is set to a value smaller than that of the select transistor. The select transistor is of an enhancement type, and the read transistor is of a depression type. The advantageous effects produced by such a combination are as described in the first embodiment. In the present invention, these effects will be further detailed. Capacity coupling exists between a gate electrode of the write transistor and the gate electrode of the read transistor that also functions as an electric charge storage region, and the charge storage region lowers in potential as the gate electrode of the write transistor decreases in potential during completion of a write operation. For example, even if a charge of 0.8 V is stored as a potential of a "high" state, this potential is lowered to 0.4 V by a capacity coupling effect. In the present invention, in particular, transistors each formed of a thin channel film small in leakage current are used and writing is speeded up by stepping up gate voltages to values greater than a supply voltage of a logic transistor. Therefore, the gate electrode of the write transistor increases in amplitude and a significant capacity coupling effect is obtainable. Setting the threshold of the read transistor to a low value as in the present embodiment is effective for enhancing a reading speed, channel resistance of the read transistor which holds a "high" state can be lowered, even in consideration of the capacity coupling effect, because a readout current can be correspondingly increased. For the select transistor, however, there is no such parasitic capacity effect and using a higher threshold is desirable for minimum non-select cell leakage current. The read transistor is of the depression type, and has its channel doped with As during manufacture. Phosphor (P) is not used, because n-type characteristics are to be assigned only to the vicinity of the substrate surface. Alternatively, after implantation of P, a density of a p-type impurity (in the present embodiment, B) to be implanted into a deep region 39 under the gate may be increased above a density of the select transistor in order to prevent punch-through in regions deeper than the vicinity of the substrate surface. The above technique of increasing the density of the p-type impurity in the deep region under the gate, above the density of the select transistor, is also effective when As is used. Even when such a technique is not used, higher energy can be used to implant As ions as the impurity, with the result that an improvement in yield can be anticipated. This is because the influence that the transistor characteristics suffer from non-uniformity in the thickness of the gate-insulating film through which the ions implanted are to pass becomes less significant. In general, use of a low threshold deteriorates short-channel characteristics. In the present embodiment, however, since, as in the first embodiment, the gate length of the read transistor is smaller than that of the select transistor, a construction is adopted that reduces a memory cell area while at the same time ensuring sufficient stability against the nonuniformity of the gate lengths.

Sixth Embodiment

Figure 12:
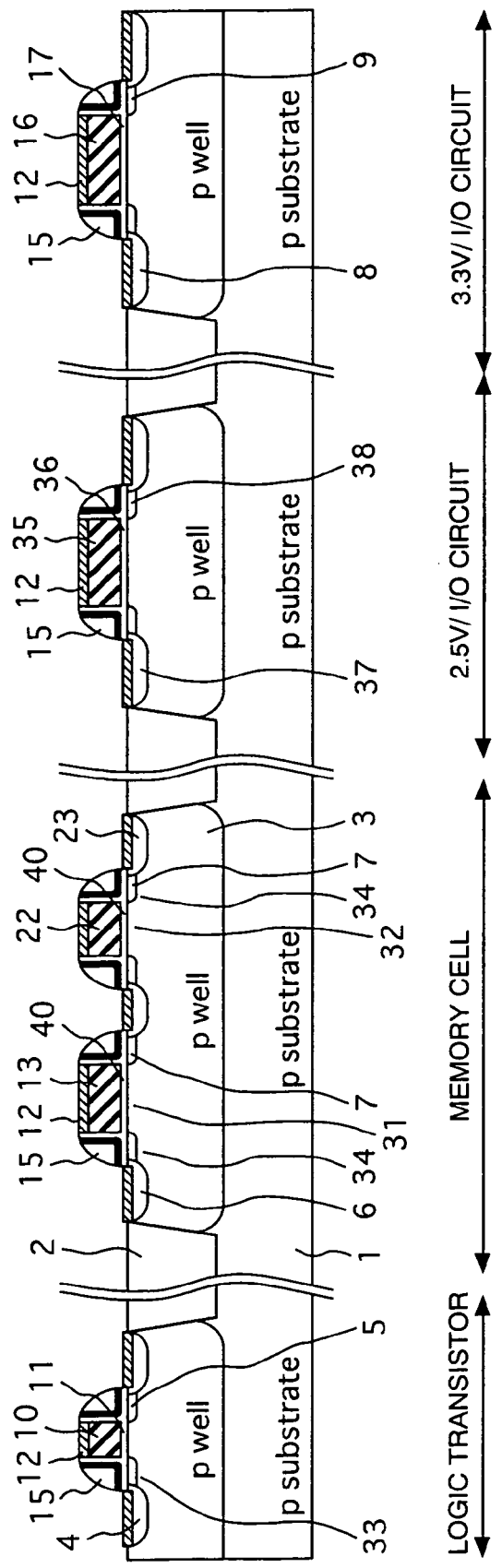
FIG. 12 is a sectional structural view explaining a construction of a semiconductor chip of a sixth embodiment, and shows a sectional view of a logic transistor, read and select transistors in memory cells, a 2.5-V I/O circuit, and a 3.3-V I/O circuit.
Figure 13:
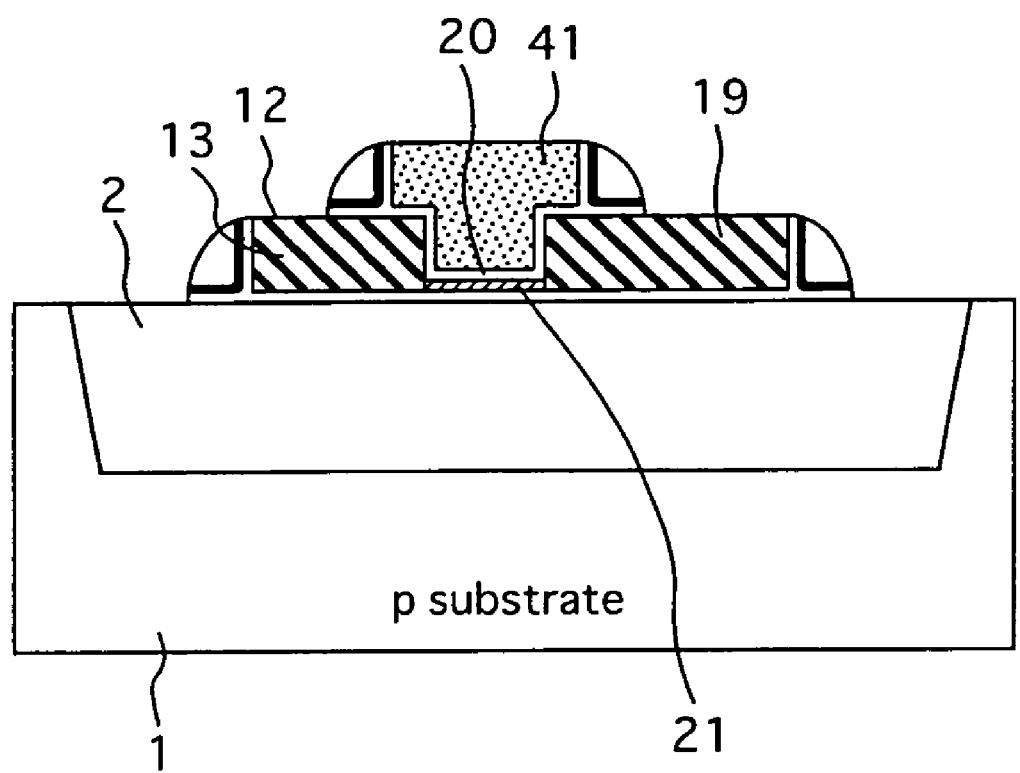
FIG. 13 is a sectional structural view explaining an internal write transistor structure within memory cells of the semiconductor chip of the sixth embodiment.

FIGS. 12, 13 show a sixth embodiment of the present invention. In this construction, a memory chip includes gate-insulating films of three thickness levels, 7 nm, 5 nm, and 2.5 nm. Although the present embodiment is the same as the first embodiment in that a 3.3-V input/output (I/O) circuit takes a transistor composition with a 7-nm-thick gate-insulating film 17, it uses an independent film thickness of 5 nm as a film thickness of a transistor gate-insulating film 36 for a 2.5-V I/O circuit. A gate-insulating film 40 of a read transistor in a memory cell block is 5 nm thick, as with the film for the 2.5-V circuit. Since the above two gate-insulating films are thinner than in the first embodiment, gate length can be reduced and a memory cell area can be correspondingly reduced. The present embodiment uses a gate length of 100 nm for both read and select transistors. The transistor for the 2.5-V I/O circuit has an extension structure 38 different from those of both the transistor used for logic, and the transistor for 3.3 V. More specifically, the above extension structure is deeper than for the logic and shallower than for 3.3 V. Extension structures 7 of the read and select transistors in the memory cell block are even shallower than for 2.5 V. During preparation of the extensions of the read and select transistors, similarly to the first embodiment, impurities for forming the extensions may be implanted in the same process steps as those of the logic block, or the implantation may be conducted in an independent process similarly to the fourth embodiment. In either case, the read transistor and the select transistor have an extension structure shallower than that of the 2.5-V transistor and higher in density.

In addition, if a gate-insulating film for 1.8-V I/O is provided, this insulating film may be used for the read transistor and select transistor of the memory cell block. Although a film thickness slightly less than 4 nm is typically used for an $SiO_2$ gate-insulating film, it is experimentally known that even if the film thickness of 4 nm is used in terms of gate-insulating film leakage current, the memory does not deteriorate too significantly in hold characteristics. In general, the pass transistor in a DRAM of a single-transistor single-capacitor construction uses an $SiO_2$ gate-insulating film whose thickness is 5 nm or more. This is not only intended to minimize leakage from the gate-insulating film, but also due to the fact that since an electrode potential of the gate is stepped up to about 2.5 V to conduct sufficient writing, the 4-nm film thickness is the minimum value needed to ensure reliability. From another viewpoint, since, in the present invention, the write transistor and the read transistor are independent of each other, the read transistor needs only to be designed so that a leakage current from its gate-insulating film may be maintained below a fixed value, and thus, an insulating film thickness less than 5 nm can be used. Sharing with 1.8-V I/O is therefore possible.

Additionally, in the present embodiment, the write transistor is not silicidized and gate electrode 41 thereof uses a polycrystalline silicon film thickness of 50 nm. The gate electrode 18 in the first embodiment uses a film thickness of 120 nm. When the write transistor block is silicidized, if the write transistor is insufficient in gate height, the silicide of the gate and that of the source/drain easily becomes connected. In the present embodiment, the gate height of the write transistor can be set to a small value by non-silicidizing. Differences in height during subsequent processing are therefore reduced and process margins are augmented. Non-silicidizing only a specific region of the write transistor can be accomplished by depositing, on the entire surface thereof, an insulating film that becomes a cover, during the process immediately preceding a desired type of silicidizing operation, then photolithographically leaving the insulating film only in a region not to be silicidized, and etching all other regions. Subsequently, normal silicidizing process steps need only to be conducted. That is, the surface is coated with a metal such as cobalt (Co), then heated and silicidized, and the metal portions that have not reacted are removed.

The meanings of the symbols and reference numbers used in the drawings accompanying the present application are as follows:

WL . . . Word line, SL . . . Source line, WWL . . . Write word line, RWL . . . Readout word line, WBL . . . Write bit line, RBL . . . Readout bit line, 1 . . . P-type silicon substrate, 2 . . . Separation element region, 3 . . . P-type well, 4 . . . Logic transistor n-type diffusion layer region, 5 . . . Logic transistor n-type extension region, 6 . . . Read transistor n-type diffusion layer region in memory cell, 7 . . . Read transistor n-type extension region in memory cell, 8 . . . High-voltage transistor n-type diffusion layer region, 9 . . . High-voltage transistor n-type extension region, 10 . . . Logic transistor gate electrode, 13 . . . Read transistor gate electrode/electric charge storage node/write transistor source or drain region in memory cell, 16 . . . High-voltage transistor gate electrode, 18 . . . Write transistor gate electrode in memory cell, 19 . . . Write transistor source or drain region in memory cell, 20 . . . Write transistor gate electrode in memory cell, 21 . . . Write transistor channel in memory cell, 22 . . . Select transistor gate electrode in memory cell.

What is claimed is:

1. A semiconductor memory device having on a semiconductor substrate:
    a logic block;
    a memory block constituted by a plurality of unit memory cells; and
    a high-voltage block supplied with a first voltage larger than a voltage which is supplied to said logic block and said memory block;
    wherein said unit memory cells each include at least two transistors:
    a write transistor connected at either a source or drain thereof to a bit line and at the other to an electric charge storage node, said write transistor storing an electric charge into, and releasing the electric charge from, said electric charge storage node; and
    a read transistor whose conductance in a channel region provided between a source and drain of said read transistor is changed dependently on an amount of electric charge stored into or released from said electric charge storage node by said write transistor;
    wherein said read transistor has a gate-insulating film thicker than that of a transistor provided in said logic block; and
    wherein a diffusion layer that determines gate length of said read transistor is provided adjacently to a high-density impurity diffusion region which forms part of the source or drain of said read transistor, said diffusion layer having a junction depth smaller than, and an impurity density higher than, those of a diffusion layer which determines gate length of a transistor constituting said high-voltage block.

2. The semiconductor memory device according to claim 1, wherein said write transistor has a channel region formed of silicon having a thickness of 5 nm or less.

3. The semiconductor memory device according to claim 1, wherein said write transistor has a channel region formed of amorphous silicon.

4. The semiconductor memory device according to claim 1, wherein said write transistor has a gate electrode formed of metal.

5. The semiconductor memory device according to claim 1, wherein at least either the source or drain of said write transistor is formed of metal.

6. A semiconductor memory device having on a semiconductor substrate:
    a logic block;
    a memory block constituted by a plurality of unit memory cells; and
    a high-voltage block supplied with a first voltage larger than a voltage which is supplied to said logic block and said memory block;
    wherein said unit memory cells each include three transistors:
    a write transistor connected at either a source or drain thereof to a bit line and at the other to an electric charge storage node, said write transistor storing an electric charge into, and releasing the electric charge from, said electric charge storage node;

a read transistor whose conductance in a channel region provided between a source and drain of said read transistor is changed dependently on an amount of electric charge stored into or released from said electric charge storage node by said write transistor; and a select transistor connected in series to said read transistor, a gate electrode of said select transistor being connected to a memory cell selection word line;

wherein said read transistor and said select transistor have a gate-insulating film thicker than that of a transistor which constitutes said logic block; and wherein a diffusion layer that determines gate length of said read transistor is provided adjacently to a high-density impurity diffusion region which forms part of the source or drain of said read transistor, said diffusion layer having a junction depth smaller than, and an impurity density higher than, those of a diffusion layer which determines gate length of a transistor constituting said high-voltage block.

7. The semiconductor memory device according to claim 6, wherein said read transistor is greater than said select transistor in terms of gate length.

8. The semiconductor memory device according to claim 7, wherein said write transistor has a channel region formed of silicon having a thickness of 5 nm or less.

9. The semiconductor memory device according to claim 7, wherein said write transistor has a channel region formed of amorphous silicon.

10. The semiconductor memory device according to claim 6, wherein said select transistor and said read transistor each have a different threshold voltage.

11. The semiconductor memory device according to claim 10, wherein said write transistor has a channel region formed of silicon having a thickness of 5 nm or less.

12. The semiconductor memory device according to claim 6, wherein said select transistor has a surface-silicidized gate electrode and said read transistor has a gate electrode whose surface is not silicidized.

13. The semiconductor memory device according to claim 12, wherein said write transistor has a channel region formed of silicon having a thickness of 5 nm or less.

14. The semiconductor memory device according to claim 6, further having sidewalls formed on both side faces of each of gate electrodes of said select transistor and said read transistor;

wherein a diffusion layer for determining gate length is formed in said semiconductor substrate positioned below said sidewalls; and wherein a diffusion layer region into which is introduced an impurity having a high density compared with an impurity density of said diffusion layer for determining gate length is provided adjacently to either one of ends of a diffusion layer for determining gate length of said select transistor.

15. The semiconductor memory device according to claim 14, wherein said write transistor has a channel region formed of silicon having a thickness of 5 nm or less.

16. The semiconductor memory device according to claim 6, wherein said write transistor has a channel region formed of silicon having a thickness of 5 nm or less.

17. The semiconductor memory device according to claim 6, wherein said write transistor has a channel region formed of amorphous silicon.

18. The semiconductor memory device according to claim 6, wherein said write transistor has a gate electrode formed of metal.

19. The semiconductor memory device according to claim 6, wherein at least either the source or drain of said write transistor is formed of metal.

* * * * *